United States Patent
Nadd et al.

(10) Patent No.: US 7,235,825 B2
(45) Date of Patent: Jun. 26, 2007

(54) IGBT WITH INJECTION REGIONS BETWEEN MOSFET CELLS

(75) Inventors: Bruno Charles Nadd, Lourmarin (FR); Daniel M. Kinzer, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 11/407,489

(22) Filed: Apr. 20, 2006

(65) Prior Publication Data

US 2006/0237793 A1  Oct. 26, 2006

Related U.S. Application Data

(60) Provisional application No. 60/674,371, filed on Apr. 22, 2005.

(51) Int. Cl.
*H01L 27/148* (2006.01)
(52) U.S. Cl. .................. 257/218; 257/331; 257/355
(58) Field of Classification Search ............... 257/331, 257/355, 218
See application file for complete search history.

(56) References Cited

U.S. PATENT DOCUMENTS 5,168,331 A * 12/1992 Yilmaz .................... 257/331

* cited by examiner

*Primary Examiner*—Douglas M. Menz
(74) *Attorney, Agent, or Firm*—Ostrolenk, Faber, Gerb & Soffen, LLP

(57) ABSTRACT

A cellular MOSgated device of planar or trench topology has base injection regions formed between pairs of cells to inject minority carriers to modulate the resistivity of the drift region.

11 Claims, 3 Drawing Sheets

IGBT WITH INJECTION REGIONS BETWEEN MOSFET CELLS

RELATED APPLICATIONS

This application claims the benefit and priority of U.S. Provisional Application No. 60/674,371, filed Apr. 22, 2005 the entire disclosure of which is incorporated by reference herein.

FIELD OF THE INVENTION

This invention relates to semiconductor devices and more specifically relates to a high voltage 4 terminal switching device.

BACKGROUND OF THE INVENTION

High voltage, high current semiconductor switching devices are known. One such device is the insulated gate bipolar transistor (IGBT). IGBTs usually employ a large number of spaced cells, which may be rectangular or hexagonal cells, or may be parallel stripes in planar or trench topology. Base current control in such devices is not possible; the devices may have a relatively high forward voltage drop; and the conventional IGBT has a current tail during turn off.

BRIEF DESCRIPTION OF THE INVENTION

In accordance with the invention, and in an N channel planar or trench topology device employing spaced MOSFET cells, a P type base injection region connected to a separate base terminal is provided between the cells to inject minority carriers to modulate the resistivity of the N-drift region in the manner of the conductivity modulation provided in the conventional IGBT.

In one embodiment of the invention, the P region injector may be at the same surface of the die as the MOSFET cells.

In a second embodiment of the invention, insulation trenches can be provided on opposite sides of the P injection region to ensure better distribution of the injected minority carriers.

In a third embodiment of the invention, the P injection region is buried beneath the surface of the device and between cells to improve the modulator efficiency.

In a fourth embodiment of the invention, a high voltage trench FET has a P (hole) injection region between trenches in which base current is removed a few hundred nanoseconds before turning off a FET channel.

DETAILED DESCRIPTION OF THE INVENTION

Figure 1:
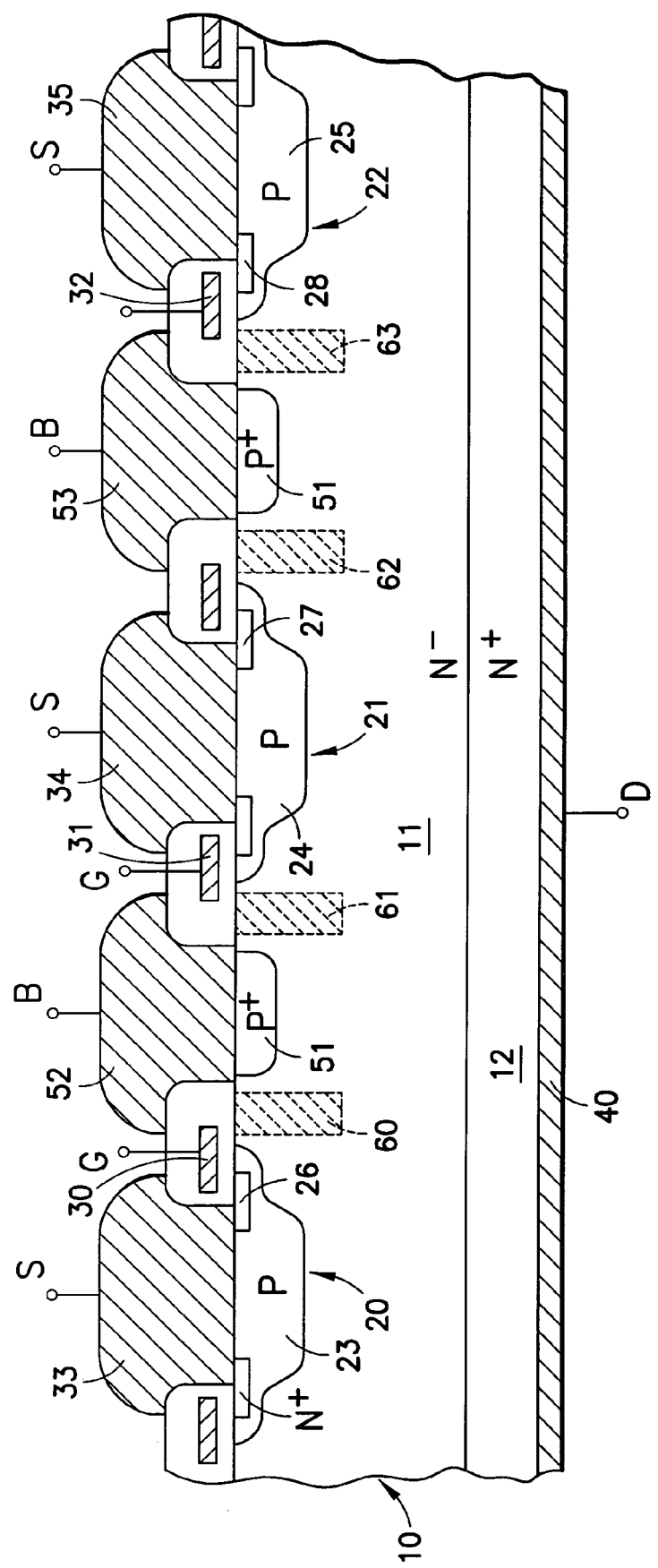
FIG. 1 is a cross-section of a few cells of a 4 terminal switching device made in accordance with the invention, showing first and second embodiments of the invention.

Referring first to FIG. 1, there is shown a portion of a silicon die 10 of $N^+$ type silicon. Note that an N-channel device is described. All conductivity types can be reversed to make a P channel device.

An $N^-$ epitaxial layer 11 of suitable thickness and concentration is formed atop the $N^+$ substrate 12, and a plurality of spaced identical MOSFET cells 20, 21 and 22 are formed in the top of the die 10. Cells 20, 21 and 22 may have any desirable topology (rectangular, stripe, etc.) and consist of a P type channel region 23, 24, 25 respectively and $N^+$ source regions 26, 27, 28 respectively.

Insulated gate segments 30, 31 and 32 are formed atop gate oxides and over the invertible channel region portions of each cell and are suitably connected to gate electrodes. Source electrodes 33, 34 and 35 are conventionally connected to source regions 30 to 32 respectively and to P channel regions 23, 24 and 25 respectively.

A drain electrode 40 is connected to the bottom of $N^+$ region 12.

The structure described to this point is a conventional 3 terminal vertical conduction MOSFET. In accordance with the invention, $P^+$ injection regions 50, 51 are diffused into the die surface and between adjacent cells and receive separate fourth terminals or electrodes 52 and 53 respectively. The P regions 50 and 51 act with $N^-$ region 11 as diodes, which will inject minority carriers into the $N^-$ region 11 when the device is turned on and the diodes are forward biased. This will then conductively modulate region 11 to reduce its on-resistance in the manner of the conventional IGBT. However, the injection is easily controlled with the present invention by separately controlling the current injected into fourth terminals 52.

In order to improve the distribution of the injected minority carriers from regions 50 and 51, and in accordance with a second embodiment of the invention, insulation trenches 60, 61, 62, 63, shown in dotted lines in FIG. 1, can be positioned between injection emitters or P regions 50 and 51 and the cells 20, 21 and 22 adjacent to regions 50 and 51.

Figure 2:
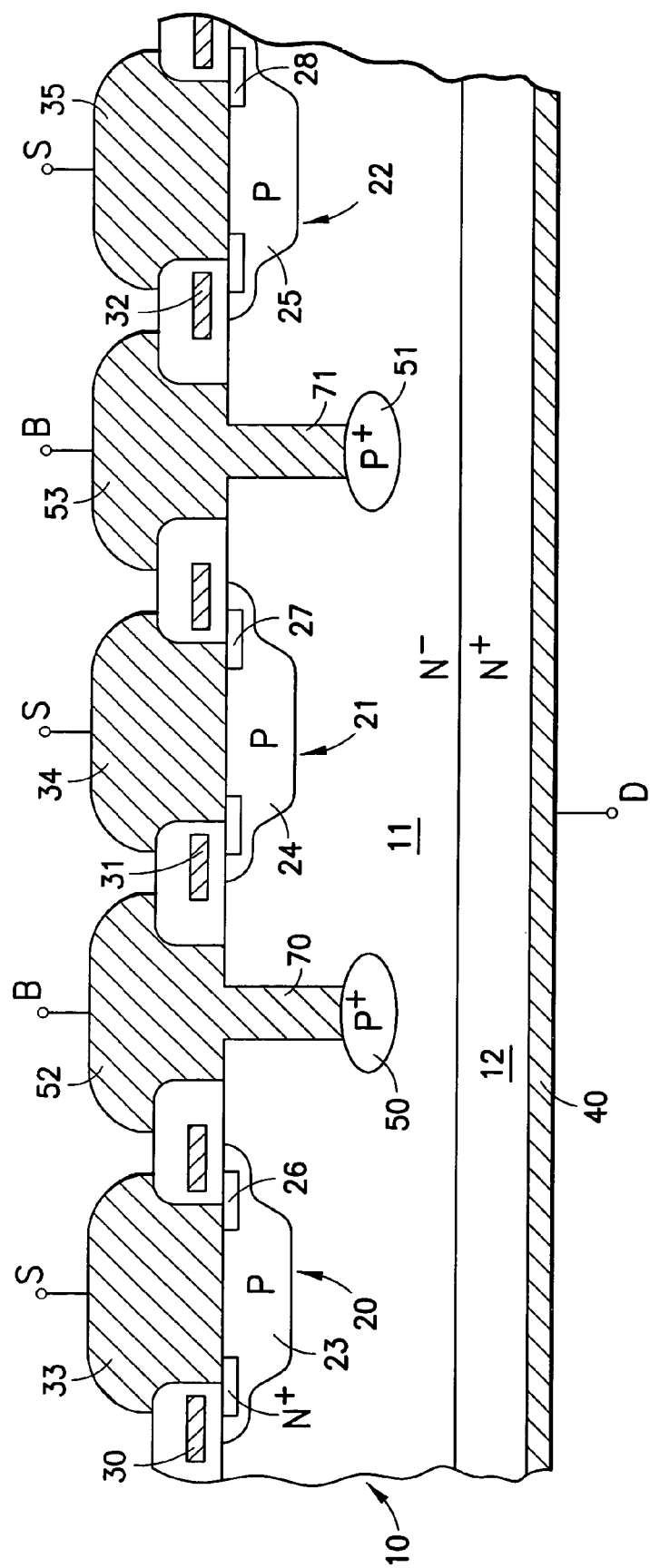
FIG. 2 is a cross-section like that of FIG. 1, showing a third embodiment of the invention.

A third embodiment of the invention is shown in FIG. 2, in which parts identical to those of FIG. 1 have the same identifying numerals. FIG. 2 differs from FIG. 1 in that the P injection regions 50 and 51 are buried under the die surface and are connected to base electrodes 52 and 53 by trench conductors 70 and 71 respectively. This is expected to produce a more evenly distributed minority carrier distribution within $N^-$ drift region 11.

Thus, the invention provides a 4 terminal IGBT type device in which base current can be controlled. When the diode formed by regions 50 and 51 is forward biased, holes will be injected into $N^-$ region 11 to modulate its conductivity. To ensure that injected holes reach $N^+$ region 12, the regions 50 and 51 may be located symmetrically between the device cells and opposite surfaces; or trenches 60 to 63 can be employed.

Since base current can be separately controlled, its device can be turned off without a current tail, as in the conventional IGBT.

Figure 3:
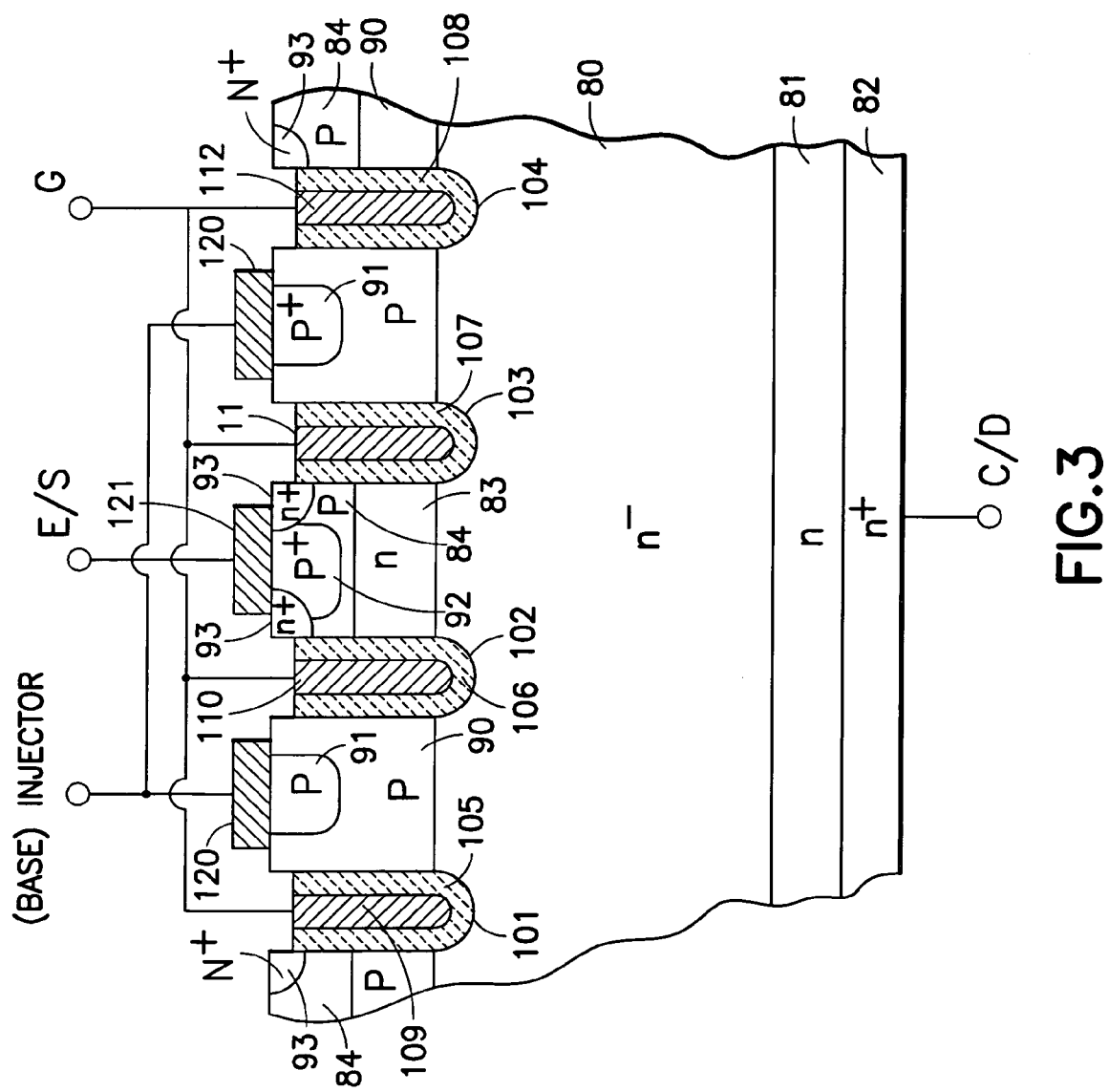
FIG. 3 is a cross-section of a few cells of a device of the invention employing a trench topology.

FIG. 3 shows the invention in a high voltage (HV) trench topology. Thus, in FIG. 3, an $N^-$ die or wafer 80 having an N type collector region 81 and $N^+$ collector contact region 82 which receives collector (or drain) electrode "C" is provided. The top surface of the die receives an N type region 83, a P type channel region 84, a P type base diffusion 90 having $P^+$ base contact diffusions 91 and a $P^+$ emitter (or source) contact diffusion 92. $N^+$ emitter regions 93 are formed as shown.

Thereafter, trenches which may be spaced parallel trenches or spaced cellular trenches are formed in the top of the die, shown as trenches 101, 102, 103, 104 and these are lined with gate oxide layers 105, 106, 107 and 108 respectively. The trenches are then filled with conductive polysilicon gates 109, 110, 111 and 112 respectively which are connected to a common gate electrode "G". Base diffusion regions 91 then receive base electrodes 120 which are connected to a common "base" contact, and the plural spaced emitter regions, one of which is shown as region 92, which receives an emitter electrode 121. All emitter electrodes 121 will be connected to the common emitter contact "E". It will be understood that a large number of emitter and base contacts are interleaved over the active area of the die 80, and only a small area is shown in FIG. 3.

In operation, holes are controllably injected into region 80 from base regions 90 for conductivity modulation. Fast switching can be obtained by a properly timed base drive in which base current is removed a few hundred nanoseconds prior to turning off the FET channel 84 adjacent the trenches.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device having controllable conductivity modulation; said device comprising a semiconductor die having flat parallel top and bottom surfaces; a plurality of spaced identical MOSFET type cells formed into said top surface; a plurality of base diffusion regions disposed between respective pairs of said MOSFET cells for injecting minority carriers into the regions of said die between MOSFET cells; each of said MOSFET cells having a gate and source contact at said top surface; said base region having a base contact on said top surface and which is spaced from said gate and source contacts; and a drain contact on said bottom surface.

2. The device of claim 1, which further includes an insulation barrier disposed between each pair of said MOSFET cells and base diffusions.

3. The device of claim 1, wherein said base diffusion is disposed into said top surface.

4. The device of claim 1, wherein said base diffusion is formed beneath and is buried under top surface.

5. The device of claim 3, which further includes an insulation barrier disposed between each of said MOSFET cells and each of said base diffusions.

6. The device of claim 1, wherein said base diffusion regions are of the P type conductivity.

7. The device of claim 2, wherein said base diffusion regions are of the P type conductivity.

8. The device of claim 3, wherein said base diffusion regions are of the P type conductivity.

9. The device of claim 4, wherein said base diffusion regions are of the P type conductivity.

10. The device of claim 1, wherein said MOSFET cells have a trench topology.

11. The device of claim 1, wherein said top surface contains a plurality of spaced trenches, each lined with insulation material and filled with a conductive material to define said gate contact; alternate mesas between said trenches defining a MOSgated trench device of one conductivity type and an injection region of the other conductivity type for minority carrier injection into the drift region leading to said bottom surface.

* * * * *